United States Patent
Tourne et al.

(10) Patent No.: US 7,096,555 B2
(45) Date of Patent: Aug. 29, 2006

(54) CLOSED LOOP BACKDRILLING SYSTEM

(75) Inventors: Joseph A. A. M. Tourne, Helmond (NL); Patrick P. P. Lebens, Sittard (NL)

(73) Assignee: Viasystems Group, Inc., St. Louis, MO (US)

( * ) Notice: Subject to any disclaimer, the term of this patent is extended or adjusted under 35 U.S.C. 154(b) by 0 days.

(21) Appl. No.: 10/944,583

(22) Filed: Sep. 17, 2004

(65) Prior Publication Data
US 2005/0128672 A1 Jun. 16, 2005

Related U.S. Application Data (60) Provisional application No. 60/504,399, filed on Sep. 19, 2003.

(51) Int. Cl.
*B23P 6/00* (2006.01)
*H05K 1/16* (2006.01)

(52) U.S. Cl. .............. 29/402.06; 29/402.01; 29/825; 29/852; 174/260; 174/261; 361/784; 361/790; 408/1 R; 408/12; 408/13; 333/204

(58) Field of Classification Search ........... 29/825, 29/852, 739, 402.01, 402.06; 408/1 R, 12, 408/13; 174/260, 261, 262; 361/784, 790; 333/204

See application file for complete search history.

(56) References Cited

U.S. PATENT DOCUMENTS

| 3,120,136 A * | 2/1964 | Bieker ............... 408/1 R |
|---|---|---|
| 3,739,461 A * | 6/1973 | Cupler, II. .............. 29/557 |
| 4,543,715 A * | 10/1985 | Iadarola et al. ............ 29/852 |
| 4,644,335 A | 2/1987 | Wen |
| 4,765,784 A | 8/1988 | Karwan |
| 4,789,770 A | 12/1988 | Kasner et al. |
| 4,826,370 A | 5/1989 | Conradsson |
| 4,872,787 A * | 10/1989 | Arai et al. ............... 408/1 R |
| 5,105,175 A * | 4/1992 | Kaltenecker ............ 333/219 |
| 5,139,376 A * | 8/1992 | Pumphrey ............... 408/1 R |
| 5,154,546 A * | 10/1992 | Neumann et al. .......... 408/1 R |
| 5,191,174 A * | 3/1993 | Chang et al. ............. 174/266 |

(Continued)

FOREIGN PATENT DOCUMENTS

DE 4340249 A1 11/1993

(Continued)

*Primary Examiner*—Carl J. Arbes
(74) *Attorney, Agent, or Firm*—Dunlap, Codding & Rogers, P.C.

(57) ABSTRACT

A multilayer circuit board is provided with at least one signal layer, at least one feedback layer, and at least one dielectric layer positioned between the signal layer and the feedback layer. The signal layer is connected to at least one plated hole. The feedback layer has a contact pad, which is positioned adjacent to the plated hole, but is electrically isolated from the plated hole. The contact pad is connected to a measurement unit. The dielectric layer is positioned between the signal layer and the contact pad of the feedback layer. A portion of the plated hole forms a stub portion, which extends a distance away from the signal layer and typically extends a distance away from the contact pad of the feedback layer. To remove the stub portion, a hole is bored or routed into the multilayer circuit board until electrical feedback is received by the measurement unit upon contact of a portion of the boring device with the contact pad. Upon receipt of the electrical feedback by the measurement unit, the boring device is retracted from the hole, and the hole formed by the boring device is filled with an epoxy, or other filler material.

27 Claims, 6 Drawing Sheets

U.S. PATENT DOCUMENTS

| | | | | |
|---|---|---|---|---|
| 5,257,531 A | * | 11/1993 | Motosugi et al. | 73/660 |
| 5,301,420 A | * | 4/1994 | Cho et al. | 29/840 |
| 5,529,441 A | * | 6/1996 | Kosmowski et al. | 408/1 R |
| 5,630,272 A | * | 5/1997 | Wenke | 29/852 |
| 6,015,249 A | * | 1/2000 | Sacchetti | 409/186 |
| 6,257,348 B1 | * | 7/2001 | Momochi et al. | 173/1 |
| 6,309,151 B1 | * | 10/2001 | Sacchetti | 409/131 |
| 6,372,999 B1 | * | 4/2002 | Bjorndahl et al. | 174/262 |
| 6,525,538 B1 | | 2/2003 | Mercer | |
| 6,750,403 B1 | * | 6/2004 | Peterson | 174/255 |
| 6,839,964 B1 | * | 1/2005 | Henson | 29/852 |
| 6,857,828 B1 | * | 2/2005 | Weber et al. | 408/1 R |

FOREIGN PATENT DOCUMENTS

| | | | |
|---|---|---|---|
| JP | 362264812 A | * | 11/1987 |
| JP | 06112659 A | * | 4/1994 |
| JP | 2000280200 A | * | 10/2000 |
| SE | 9003587 A | * | 5/1992 |

* cited by examiner

CLOSED LOOP BACKDRILLING SYSTEM

CROSS-REFERENCE TO RELATED APPLICATIONS

The present patent application claims priority to the provisional patent application identified by U.S. Ser. No. 60/504,399, filed on Sep. 19, 2003, the entire content of which is hereby incorporated herein by reference.

BACKGROUND OF THE INVENTION

Multilayer circuit boards and/or wiring boards are well known in the art. The multilayer circuit boards are formed with a number of signal layers (conductive layers) which are arranged in a predetermined pattern. The signal layers are insulated from each other by dielectric layers. Thus, the multilayer circuit board is formed from interleaved (e.g., alternating) signal layers and dielectric layers.

Plated holes or "vias" are formed through the multilayer circuit board to connect one signal layer to another signal layer. The plated holes typically extend from one main side of the multilayer circuit board to an opposite side of the multilayer circuit board. In some instances, the plated holes or vias include a "stub portion" which extends away from the signal layer toward one of the sides of the multilayer circuit board. In some circumstances, it is desirable to remove the stub portion to enhance the signal to noise ratio in electronic systems that utilize high-speed signals. The smaller the stub portion the better the signal quality.

In the past, the stub portion of the plated holes is removed in a process referred to as "back drilling". In the back drilling process, the stub portion of the plated hole is removed by drilling the stub portion to a predetermined depth. However, in practice the thicknesses of the various layers in the multilayer circuit boards are not uniform, and the depths of the signal layers within the multilayer circuit boards vary, which often changes the amount of the stub portion which needs to be removed. Drilling too deeply will disconnect the signal layer from the plated hole, or leave an unreliable connection; not drilling deep enough decreases the signal to noise ratio.

The invention discussed herein uses a technique which overcomes the problems associated with the variance in thickness of the layers in the multilayer circuit board.

SUMMARY OF THE INVENTION

Figure 2:
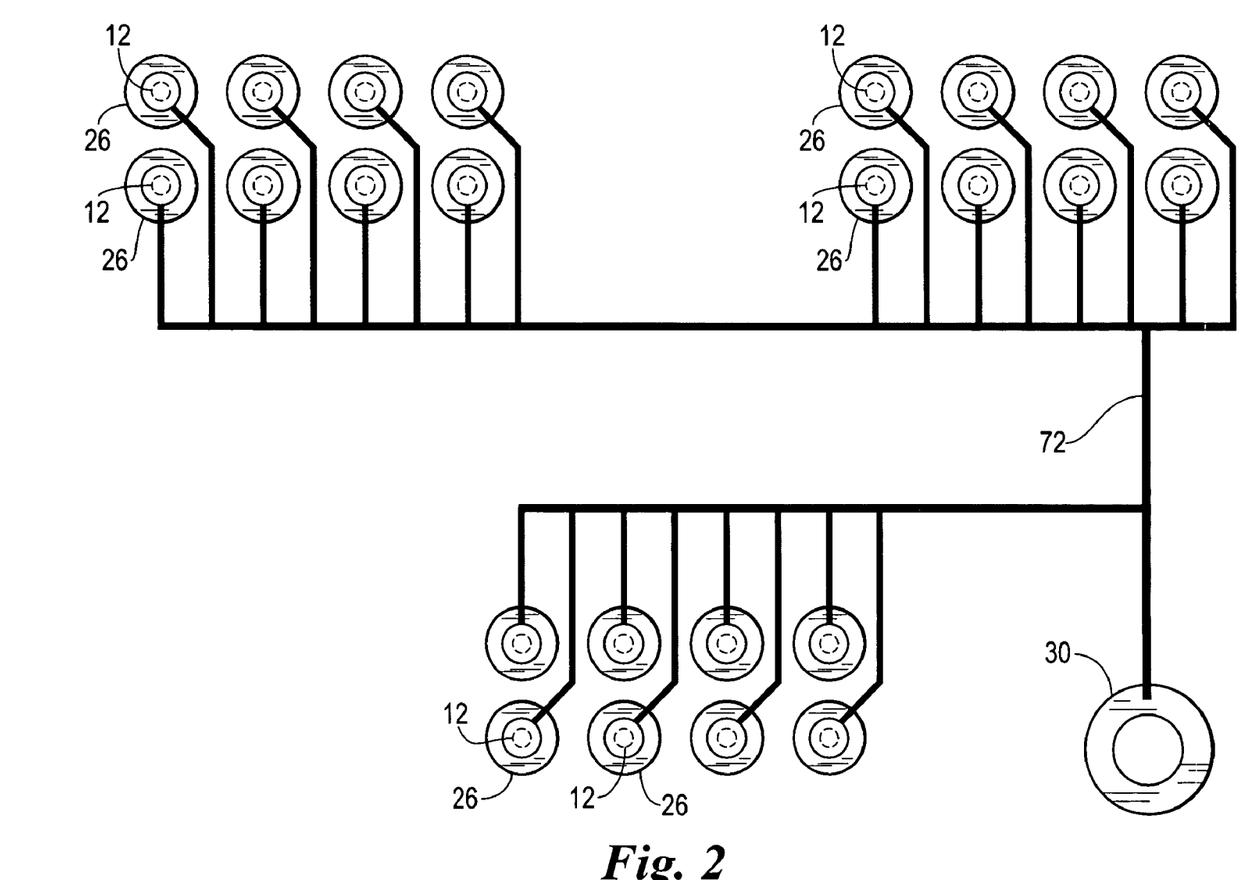
FIG. 2 is a top plan view of one embodiment of a feedback layer formed in a multilayer circuit board wherein the feedback layer forms a separate network.

In general, the present invention relates to a multilayer circuit board, and a closed loop backdrilling system for backdrilling the multilayer circuit board. The multilayer circuit board is provided with at least one signal layer, at least one feedback layer, and at least one dielectric layer positioned between the signal layer and the feedback layer. The signal layer is connected to at least one plated hole. The feedback layer has a contact pad, which is positioned adjacent to the plated hole and is connected to a signal/electrical source, but is electrically isolated from the plated hole. The dielectric layer is positioned between the signal layer and the contact pad of the feedback layer. A portion of the plated hole forms a stub portion, which extends a distance away from the signal layer and typically extends a distance away from the contact pad of the feedback layer. The feedback layer can be any layer within the multilayer circuit board, such as a separate network layer as shown in FIG. 2, or a ground layer, signal layer, or power layer.

To remove the stub portion, a hole is bored or routed into the multilayer circuit board until electrical feedback is received from the feedback layer of the multilayer circuit board when a certain depth is reached. Typically, the electrical feedback is received from the multilayer circuit board upon contact of a portion of the boring device with the feedback layer. Upon receipt of the electrical feedback from the multilayer circuit board, the boring device is retracted from the hole, and the hole formed by the boring device can then be filled with an epoxy, or other filler material.

In one preferred embodiment, the feedback layer is only used during the manufacturing process of the multilayer circuit board. In other words, in this embodiment, once the manufacturing process is complete, the feedback layer is not used to connect any components or signal layers or for any other electrical type of purpose.

DETAILED DESCRIPTION OF THE INVENTION

Figure 1:
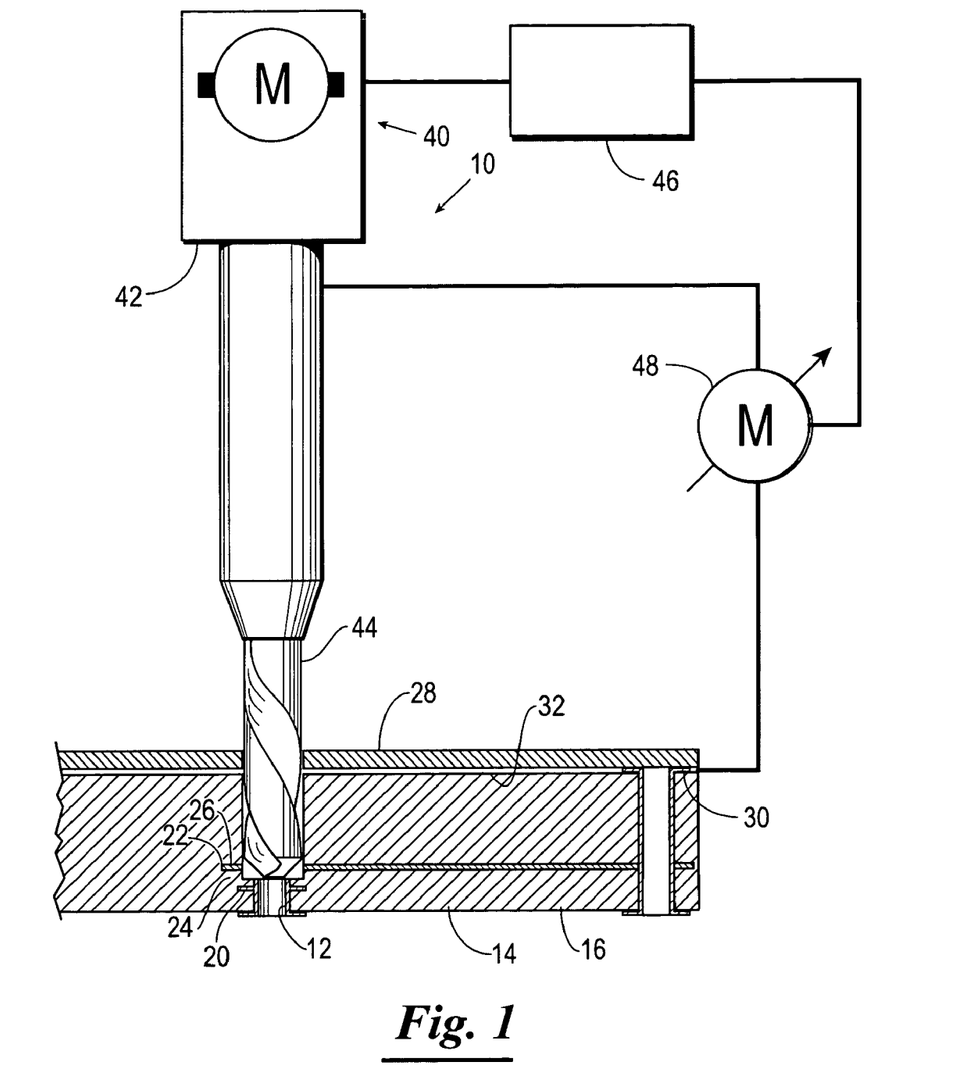
FIG. 1 is a diagrammatic view of a closed loop backdrilling system constructed in accordance with the present invention.

Referring now to the drawings and in particular to FIG. 1, shown therein and designated by a reference numeral 10 is a closed loop backdrilling system constructed in accordance with the present invention. The closed loop backdrilling system 10 is used for depth drilling an already plated hole 12 formed in a workpiece 14 using electrical feedback from the workpiece 14 when a certain or predetermined depth is reached. The feedback during the drilling process makes it possible to yield much higher accuracy independent of the depth of a particular layer within the workpiece 14. In one preferred embodiment, the workpiece 14 is a multilayer printed circuit board 16. Although the workpiece 14 will be described herein as the multilayer circuit board 16, it should be understood that the workpiece 14 can be any apparatus, or device where it is desirable to drill to a certain or predetermined depth within the apparatus or device.

The multilayer circuit board 16 is provided with at least one or more signal layer 20, at least one or more feedback layer 22, and at least one or more dielectric layer 24. The signal layer 20 is connected to the plated hole 12. The feedback layer 22 has a contact pad 26 (see FIG. 4). The contact pad 26 is spaced a distance away from the signal layer 20 and is electrically insulated from the plated hole 12. The dielectric layer 24 is positioned between the signal layer 20 and the contact pad 26 of the feedback layer 22 so as to electrically isolate the contact pad 26 from the signal layer 20. As will be discussed in more detail below, the contact pad 26 is contacted during the manufacturing process of the multilayer circuit board 16 to provide electrical feedback.

The multilayer circuit board 16 is also provided with an entry material 28, and a second plated hole 30. The entry material 28 extends over a first surface 32 of the multilayer circuit board 16. Entry materials, such as the entry material 28 are well known in the art. Thus, no further comments are deemed necessary regarding the entry material 28 to teach one skilled in the art how to make or use the present invention. The second plated hole 30 is electrically connected to the contact pad 26 of the feedback layer 22.

The closed loop backdrilling system 10 is provided with a boring device 40. The boring device 40 is provided with a spindle unit 42 supporting a cutting device 44, and a servo control unit 46 for the Z-axis motor control. The boring device 40 can be a drill, milling machine or router.

The closed loop backdrilling system 10 is also provided with a measurement unit 48. The measurement unit 48 communicates with 1) the spindle unit 42 and/or the cutting device 44 of the spindle unit 42, and 2) the second plated hole 30 for determining the contact or proximity between the cutting device 44 and the contact pad 26 of the feedback layer 22.

In general, the measurement unit 48 senses a transition of a physical property indicative of contact or close proximity between the cutting device 44 and the contact pad 26. In one preferred embodiment, the measurement unit 48 includes a capacitive sensor due to the airbearing construction in the drill spindle for sensing the capacitance between the cutting device 44 and the contact pad 26. In another preferred embodiment, the measurement unit 48 is a resistance meter for measuring the resistance between the cutting device 44 and the feedback layer 22. In this instance, the cutting device 44 is constructed of a conductive material, or is plated with a conductive material. The cutting device 44 can be constructed of a cutting type material, e.g., a ceramic material or a metallic substance, such as steel.

When the cutting device 44 contacts the feedback layer 22, the resistance rapidly reduces. A signal indicative of this rapid transition is transmitted to the servo control unit 46 for controlling the spindle unit 42. When the cutting device 44 reaches the feedback layer 22, the spindle unit 42 retracts the cutting device 44 from the plated hole, or a signal is sent to the servo control unit 46 to cause the servo control unit 46 to measure further depth drilling beyond the feedback layer 22. The servo control unit 46 can be programmed to cause the cutting device 44 to move in a substantially continuous manner during the backdrilling operation. The servo control unit 46 can also be programmed for other drilling operations, such as pulse drilling, e.g., move in-stop, move in-stop, etc, or customizable drilling operations. The advantage of pulse drilling is that it breaks the burr (e.g., a thin ridge or area of roughness produced in cutting or shaping metal) while drilling and enhances the backdrilled effect. Although the present invention is described as using the servo control unit 46, it should be understood that the present invention can use other types of controllers for controlling the movement of the spindle unit 42.

Figure 3:
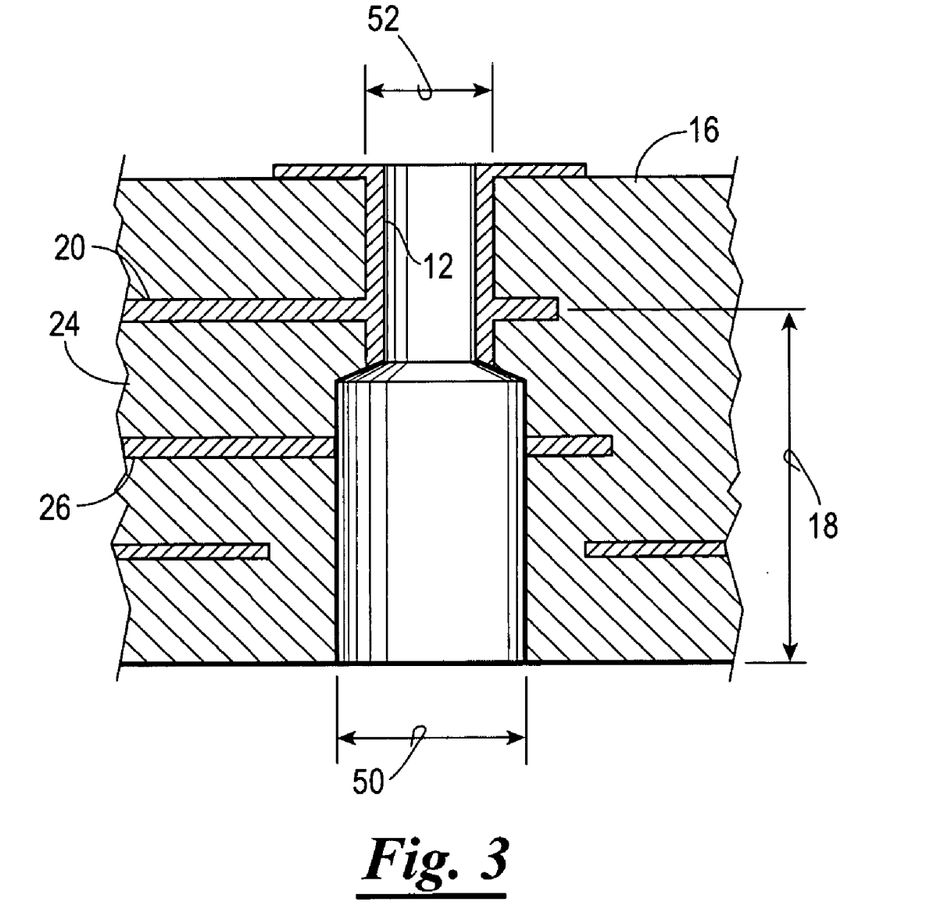
FIG. 3 is a cross-sectional view of a portion of a multilayer circuit board constructed in accordance with the present invention.

As shown in FIG. 3, the cutting device 44 forms an enlarged portion of the hole 12 having a backdrill diameter 50 during the back drilling operation. The backdrill diameter 50 (or cross-sectional area of the enlarged portion) is greater than a first drill diameter 52 (or cross-sectional area of the plated hole 12) of the plated hole 12 to remove the plating from the stub portion 18 of the plated hole 12. Thus, the cutting device 44 removes the plating of the plated hole 12 during the backdrilling operation until the cutting device 44 is retracted. It should be understood that the diameter of the cutting device 44 can be any size capable of removing the plating of the plated hole 12. In one preferred embodiment, the cutting device 44 has a diameter approximately 0.35 mm greater than the diameter of the cutting device used to form the first drill diameter 52 of the plated hole 12. Preferably the cutting device 44 forms a round hole. However, it should also be understood that the cutting device 44 can be translated or paired with another cutting device so as to form a substantially square hole, elliptical hole or the like.

Figure 4:
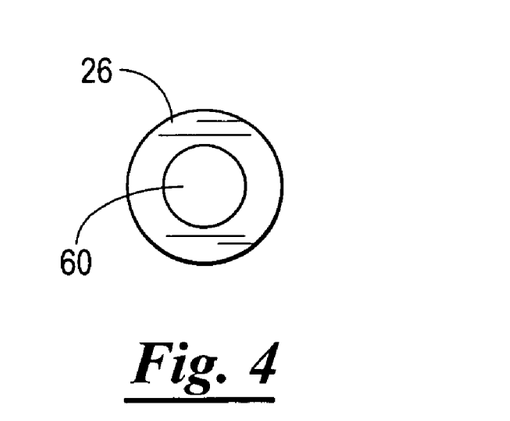
FIG. 4 is a top plan view of a contact pad of a feedback layer constructed in accordance with the present invention.
Figure 7:
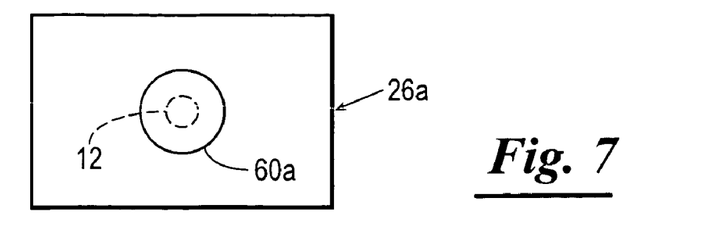
FIG. 7 is a top plan view of an alternate embodiment of a contact pad constructed in accordance with the present invention.

One preferred embodiment of the contact pad 26 is shown in FIG. 4. The contact pad 26 can have the general form of a "doughnut" forming a hole 60 therein. The contact pad 26 can also be provided with other shapes so long as a portion of the contact pad 26 is positioned adjacent to the plated hole 12 to be backdrilled. For example, shown in FIG. 7 is an alternate embodiment of a contact pad 26a formed as a portion of a ground layer within the multilayer circuit board 16. The contact pad 26a forms one or more hole 60a, i.e., a clearance hole or antipad, with the plated hole 12 extending through the clearance the hole 60a. The contact pads 26 and 26a are desirably constructed of an electrically conductive material. The size of the holes 60 and 60a can vary widely, but are preferably greater than the first diameter 52, yet less than the diameter 50 so that the contact pads 26 and 26a do not come into electrical contact with the plated hole 12. In this regard, the contact pads 26 and 26a extend adjacent to the plated hole 12, but do not contact the plated hole 12.

Although the contact pads 26 and 26a have been shown and described with regard to FIGS. 4 and 7 as having a doughnut design or rectangular design, it should be understood that the contact pads 26 and 26a can have any geometric, nongeometric or asymmetrical shape so long as the contact pads 26 and 26a are electrically insulated from the plated hole 12 and capable of contacting the cutting device 44 during the back drilling operation.

As shown in FIG. 2, it should be understood that, in one preferred embodiment, for every back drilling depth a pattern (on a specific layer) is used which is electrically connected to the second plated hole 30. The second plated hole may also be referred to herein as a "common pad". The common pad 30 is electrically connected to a plurality of contact pads 26 with each of the contact pads 26 being provided adjacent to a signal layer 20 and a plated hole 12. In other words, in a preferred embodiment the feedback layer 22 forms a predetermined pattern having a plurality (two or more) of contact pads 26 with each of the contact pads 26 being electrically connected to the common pad 30 via a pattern of conductors 72. In one preferred embodiment, the feedback layer 22 is not contacted or connected to any of the signals or signal layers in the printed circuit board 16. It should be understood that the feedback layer 22 is not limited to being implemented as a separate network as shown in FIG. 2. In this regard, the feedback layer 22 can be formed by any conductive layer within the multilayer printed circuit board 16 capable of providing an electrical signal to the contact pads 26 or 26a, such as a signal layer, a power layer or a ground plane layer.

The measurement unit 48 is electrically connected to the common pad 30 for transmitting electrical feedback to the servo control unit 46 when the cutting device 44 contacts any one of the contact pads 26 or 26a.

Although the closed loop backdrilling system 10, and in particular, the multilayer circuit board 16 has been described herein as having only one feedback layer 22, it should be understood that any number of feedback layers 22 can be used within the multilayer circuit board 16. For example, the multilayer circuit board 16 can include 2 or more feedback layers 22.

The spacing between the contact pads 26 or 26a and the signal layer 20 can vary widely depending on the size and the shape of the cutting device 44 used during the back drilling operation as well as the amount of the stub portion 18 that is desired to be removed. The spacing should be as closed to the signal layer 20 as possible but far enough away so that the spindle unit 42 of the boring device 40 can be stopped. For example, the spacing between the contact pads 26 or 26a and the signal layer 20 has been found to be suitable between about 0.004 inches and 0.001 inches.

To remove the stub portion 18, the measurement unit 48 is connected to the feedback layer 22, such as by connecting the measurement unit 48 to the common pad or second plated hole 30. The spindle unit 42 is then actuated and the servo control unit 46 causes the spindle unit 42 to move the cutting device 44 toward and into the multilayer circuit board 16. The cutting device 44 is moved into the multilayer circuit board 16 until electrical feedback is received from the feedback layer 22 indicating that a certain depth has been reached. Depending upon the application of the closed loop backdrilling system 10, the servo control unit 46 either 1) causes the spindle unit 42 to retract the cutting device 44, or 2) causes the spindle unit 42 to move the cutting device 44 a predetermined distance past the feedback layer 22 before the spindle unit 42 retracts the cutting device 44.

The process set forth above can then be repeated for each and every plated hole 12 to be backdrilled. The hole(s) formed by the cutting device 44 is/are then filled with an epoxy, or other filler material.

The closed loop back drilling system 10 can also be provided with a reporting system 80 for permitting usage of the closed loop back drilling system 10 to be monitored. The reporting system 80 receives input from a portion of the boring device 40, such as the servo-control unit 46 or the measurement unit 48 to count the number of backdrilled holes in real-time and then provides a report or an invoice periodically (daily, monthly, quarterly, etc.) showing the number of holes backdrilled on which a license fee is due. The report or invoice can be transmitted electronically to a user of the closed loop backdrilling system 10, or a designated collection entity.

The making and using of multilayer circuit boards is well known in the art. Thus, a description of the particular materials, adhesives and other factors utilized in the making of multilayer circuit boards has not been discussed in detail herein. However, examples of the various constructions and fabrication methods for attaching and forming each layer of a multilayer circuit board are disclosed in U.S. Pat. No. 5,677,515, the contents of Column 1, Line 8 through Line 55, Column 2, Line 32 through Column 3, Line 7, and the drawings referenced therein are hereby incorporated herein by reference.

Figure 5:
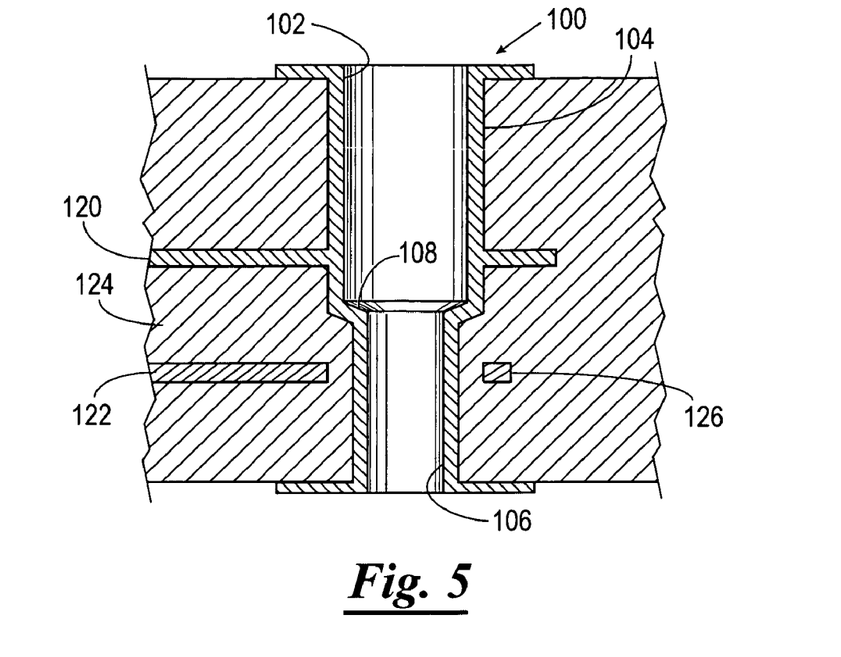
FIG. 5 is a cross-sectional view of a portion of a multilayer circuit board constructed in accordance with an alternate embodiment of the present invention.
Figure 6:
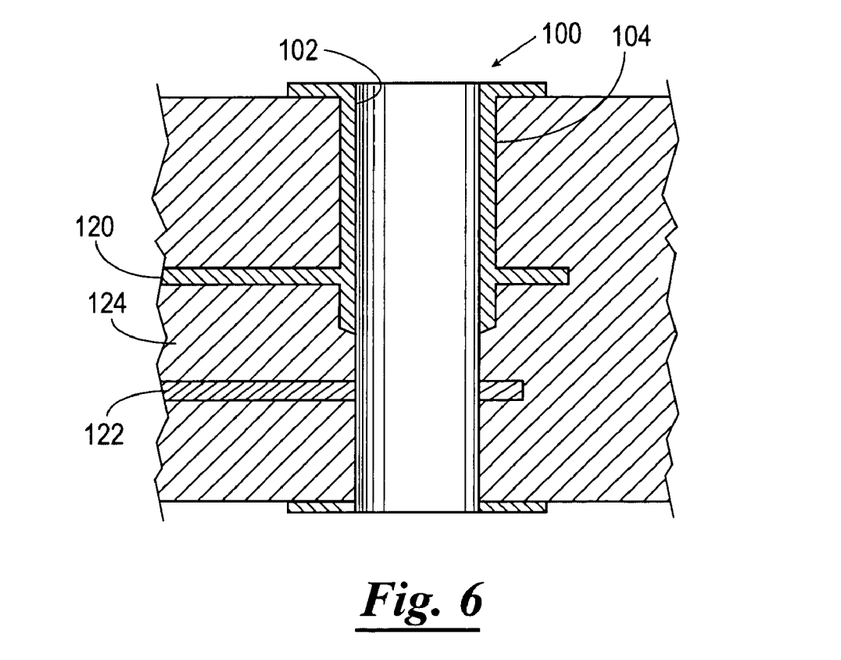
FIG. 6 is a cross-sectional view of the portion of the multilayer circuit board constructed in accordance with an alternate embodiment of the present invention.

Shown in FIGS. 5 and 6 is an alternate embodiment of a multilayer circuit board 100 constructed in accordance with the present invention. The multilayer circuit board 100 is constructed similarly to the multilayer circuit board 16 described above, except that the multilayer circuit board 100 is provided with a plated hole 102 having a stepped configuration. As will be discussed in more detail below, the stepped configuration of the plated hole 102 permits denser connections than the straight-sided plated hole 12.

The plated hole 102 is provided with a first portion 104 and a second portion 106. The first portion 104 and the second portion 106 are separated by a lateral protrusion 108. The second portion 106 has a cross-sectional area less than the cross-sectional area of the first portion 104.

The plated hole 102 can be formed in any suitable manner. For example, the plated hole 102 can be formed in one drilling operation with the use of a stepped drill bit and then subsequently plated. Alternatively, the plated hole 102 can be formed in multiple drilling operations with the use of two cutting devices or drill bits having different diameters and then subsequently plated.

The multilayer circuit board 100 includes one or more signal layer 120, one or more feedback layer 122, and one or more dielectric layer 124. The feedback layer 122 has a contact pad 126. The dielectric layer 124 is positioned between the signal layer 120 and the feedback layer 122. The plated hole 102 is connected to the signal layer 120, and positioned adjacent to the contact pad 126. The contact pad 126 is electrically isolated from the plated hole 102 by the dielectric layer 124. In general, the second portion 106 of the plated hole 102 forms the stub portion, which extends a distance away from the signal layer 120 and also extends a distance away from the contact pad 126 of the feedback layer 122.

The plated hole 102 of the multilayer circuit board 100 is then backdrilled to remove the stub portion in a similar manner as described above, with the exception that the diameter of the cutting device used in the backdrilling operation can be the same as or even a smaller diameter than the diameter of the first portion 104 of the plated hole 102. This permits a denser population of holes because the diameter of the plated hole 102 is not increased during the backdrilling operation.

The concept of embedding a contact pad within a multilayer circuit board can be used in accordance with the present invention for at least two other purposes, i.e., depth routing and guide routing.

Depth routing can be used to determine the final level of a the boring device 40 penetration depth for clearing out areas on the multi-layer circuit board to receive a component or a connector. In this application, the cutting device 44 of the boring device 40 is moved in the direction of the multilayer circuit board until the tip of the cutting device 44 contacts the contact pad. The penetration of the cutting device 44 is then stopped or moved a predetermined distance further into the multilayer circuit board. The cutting device 44 is then translated laterally (x and/or y axis) a predetermined amount to clear out the area for the component or the connector.

Guide routing can be used to guide the lateral translation (x and/or y axis) of the boring device. That is, once the cutting device 44 reaches the contact pad, the penetration level of the cutting device 44 is stopped or moved a predetermined distance further into the multilayer circuit board. The boring device 40 begins to move the multilayer circuit board or the cutting device 44 laterally and continues to move laterally while the cutting device 44 is in contact with the contact pad. When the cutting device 44 loses contact with the contact pad, the boring device 40 retracts or stops.

Figure 8:
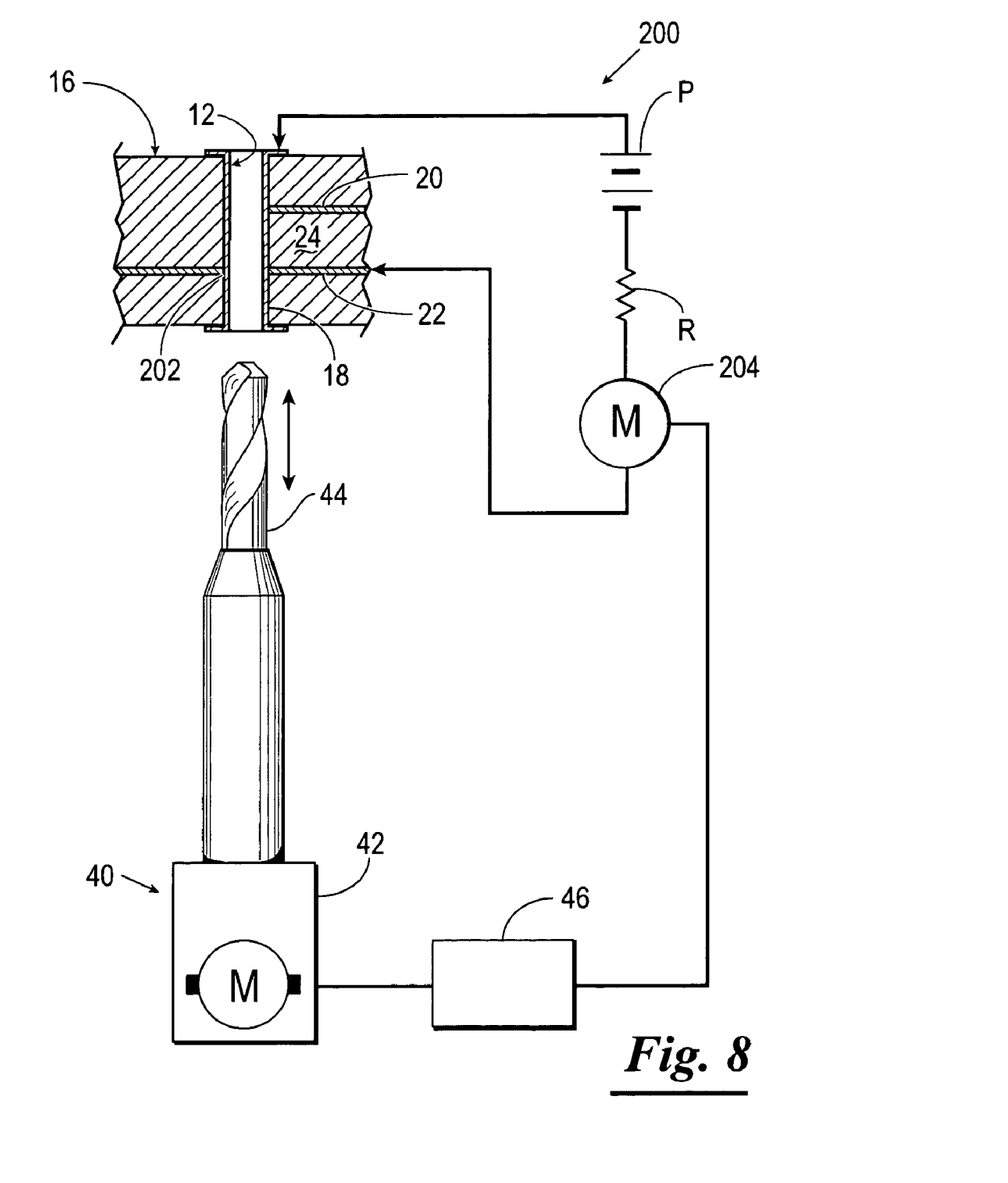
FIG. 8 is a diagrammatic view of an alternate embodiment of a closed loop backdrilling system constructed in accordance with the present invention.

Shown in FIG. 8 is an alternate embodiment of a closed loop backdrilling system constructed in accordance with the present invention. The closed loop backdrilling system 200 is used for depth drilling the already plated hole 12 formed in the workpiece 14 using electrical feedback from the workpiece 14 when a certain or predetermined depth is reached. The feedback during the drilling process makes it possible to yield much higher accuracy independent of the depth of a particular layer within the workpiece 14. As discussed above, in one preferred embodiment, the workpiece 14 is a multilayer printed circuit board 16. Although the workpiece 14 will be described herein as the multilayer circuit board 16, it should be understood that the workpiece 14 can be any apparatus, or device where it is desirable to drill to a certain or predetermined depth within the apparatus or device.

The multilayer circuit board 16 is provided with at least one or more signal layer 20, at least one or more feedback layer 22, and at least one or more dielectric layer 24. The signal layer 20 is connected to the plated hole 12. The feedback layer 22 has a contact pad 202, which is similar in construction and function as the contact pads 26 or 26a discussed above, except that the contact pad 202 is connected to the plated hole 12 to permit electrical communication therebetween. The dielectric layer 24 is positioned between the signal layer 20 and the contact pad 202 of the feedback layer 22 so as to electrically isolate the contact pad 202 from the signal layer 20. As will be discussed in more detail below, the contact pad 202 is contacted during the manufacturing process of the multilayer circuit board 16 to break the electrical connection between the plated hole 12 and the contact pad 202.

The closed loop backdrilling system 200 is provided with the boring device 40. The boring device 40 is provided with the spindle unit 42 supporting the cutting device 44, and the servo control unit 46 for the Z-axis motor control.

The closed loop backdrilling system 200 is also provided with a measurement unit 204. The measurement unit 204 communicates with a) the plated hole 12 and b) the feedback layer 22 for determining loss of electrical communication between the plated hole 12 and the feedback layer 22. As shown in FIG. 8, the measurement unit 204 is provided in circuit with a resistor R and a power supply P. The measurement unit 204 can, for example, be an ammeter for measuring either AC or DC electrical current.

In use, the spindle unit 42 of the boring device 40 is operated to move the cutting device 44 a predetermined amount in a direction toward or into the plated hole 12. The spindle unit 42 is then operated to retract the cutting device 44 a predetermined amount in a direction away from the plated hole 12 so that the conductivity of the cutting device 44 will not interfere with the reading of the measurement unit 204. The servo control unit 46 then monitors the measurement unit 204 to determine whether the feedback layer 22 is still connected to the plated hole 12. If so, the spindle unit 42 is then operated to move the cutting device 44 in the direction toward the plated hole 12 to remove more of the stub portion 18 of the plated hole 12. The spindle unit 42 is then operated to retract the cutting device 44 away from the plated hole 12 and the servo control unit 46 again monitors the measurement unit 204 to determine whether the feedback layer 22 is connected to the plated hole 12. This process is repeated until the measurement unit 204 determines that the plated hole 12 has been disconnected from the feedback layer 22.

Figure 9:
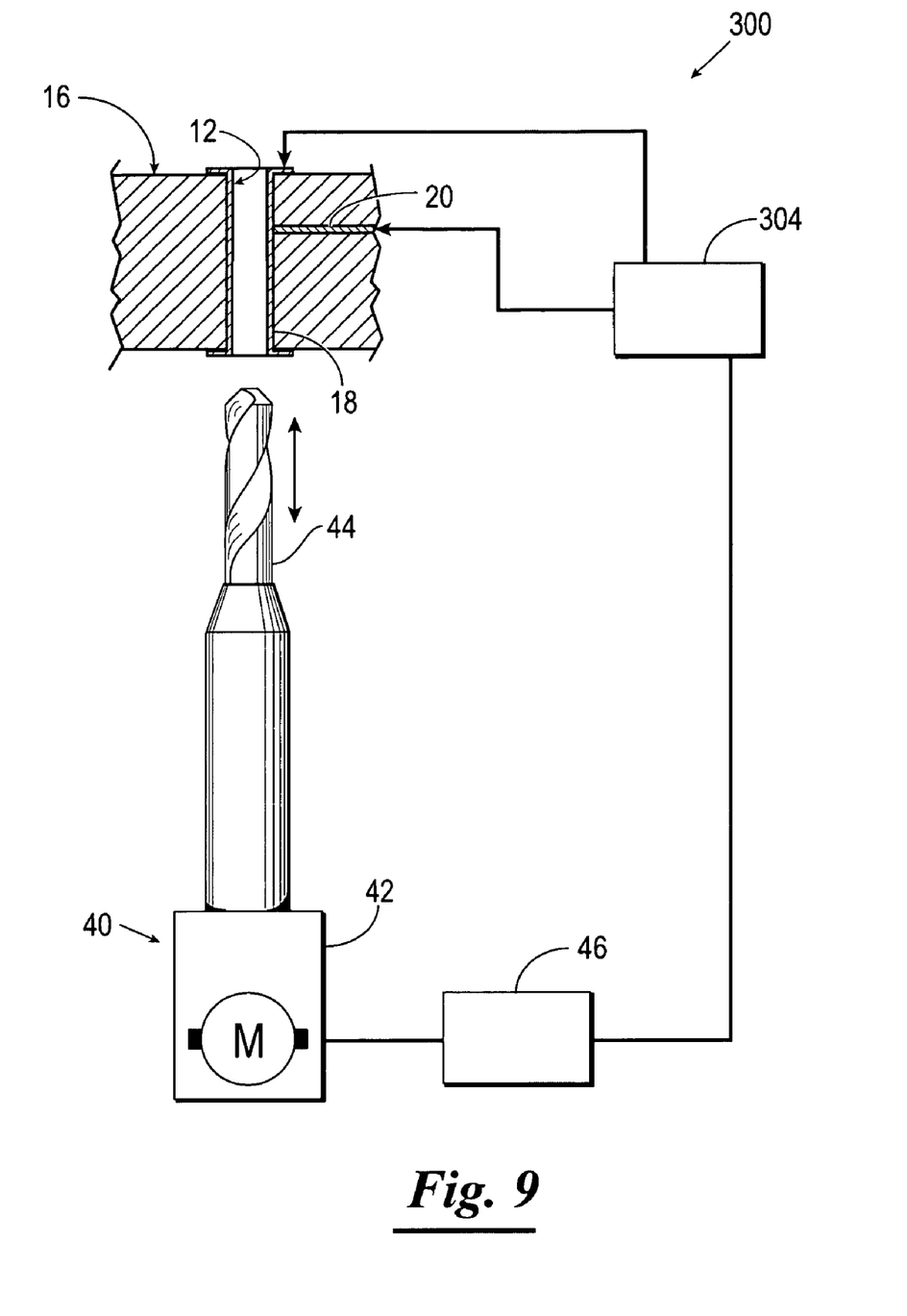
FIG. 9 is a diagrammatic view of yet another alternate embodiment of a closed loop backdrilling system constructed in accordance with the present invention.

Shown in FIG. 9 is another alternate embodiment of a closed loop backdrilling system constructed in accordance with the present invention. The closed loop backdrilling system 300 is used for depth drilling the already plated hole 12 formed in the workpiece 14 using electrical feedback from the workpiece 14 when a certain or predetermined depth is reached. The feedback during the drilling process makes it possible to yield much higher accuracy independent of the depth of a particular layer within the workpiece 14. As discussed above, in one preferred embodiment, the workpiece 14 is the multilayer printed circuit board 16. Although the workpiece 14 will be described herein as the multilayer circuit board 16, it should be understood that the workpiece 14 can be any apparatus, or device where it is desirable to drill to a certain or predetermined depth within the apparatus or device.

The multilayer circuit board 16 is provided with at least one or more signal layer 20, and at least one or more dielectric layer 24. The signal layer 20 is connected to the plated hole 12.

The closed loop backdrilling system 300 is provided with the boring device 40. The boring device 40 is provided with the spindle unit 42 supporting the cutting device 44, and the servo control unit 46 for the Z-axis motor control.

The closed loop backdrilling system 300 is also provided with a signal generator and measurement unit 304. The signal generator and measurement unit 304 communicates with a) the plated hole 12 and b) the signal layer 20 for providing a signal to the plated hole 12 and then determining the reflection or interference of the signal caused by the stub portion 18. The signal generator and measurement unit 304 can determine any appropriate physical property indicative of the existence or amount of the stub portion 18, such as the signal to noise ratio.

In use, the spindle unit 42 of the boring device 40 is operated to move the cutting device 44 a predetermined amount in a direction toward or into the plated hole 12. The spindle unit 42 is then operated to retract the cutting device 44 a predetermined amount away from the plated hole 12 so that the conductivity of the cutting device 44 will not interfere with the reading of the signal generator and measurement unit 304. The servo control unit 46 then monitors the signal generator and measurement unit 304 to determine the relatedness between the physical property being measured and a predetermined amount. For example, when the signal to noise ratio is being monitored, a determination can be made (either by the servo control unit 42 or the signal generator and measurement unit 304) whether the signal to noise ratio is above a predetermined amount indicative of removal of a sufficient amount of the stub portion 18. If not, the spindle unit 42 is then operated to move the cutting device 44 a predetermined amount in the direction toward the plated hole 12 to remove more of the stub portion 18 of the plated hole 12. The spindle unit 42 is then operated to retract the cutting device 44 away from the plated hole 12 and the servo control unit 46 again monitors the signal generator and measurement unit 304 to determine whether enough of the stub portion 18 has been removed. This process is repeated until the signals output by the signal generator and measurement unit 304 indicate that a sufficient amount of the stub portion 18 has been removed.

The closed backdrilling systems 200 and 300 can be operated either manually or automatically. In other words, the measurements made by the measurement unit 204 or the signal generator and measurement unit 304 can be made manually by an individual, who is also controlling the servo control unit 204. Alternatively, the measurements made by the measurement unit 204 or the signal generator and measurement unit 304 can be automated such that the retractions and advancements of the spindle unit 42 are controlled by a software program typically operating in or controlling the servo control unit 46.

Changes may be made in the construction and the operation of the various components, elements and assemblies described herein or in the steps or the sequence of steps of the methods described herein without departing from the spirit and scope of the invention as defined in the following claims.

What is claimed is:

1. A method for backdrilling at least one plated hole formed in a circuit board, the plated hole connected to a signal trace embedded within the circuit board such that at least a portion of the plated hole extends beyond the signal trace to form a stub portion, the method comprising the steps of:
    applying a feedback signal to a contact pad embedded within the circuit board, the contact pad positioned adjacent to the stub portion of the plated hole, the contact pad being electrically insulated from the stub portion; and
    boring into the plated hole of the circuit board to remove plating from the stub portion of the plated hole and to remove insulating material adjacent to the plated hole; and
    receiving feedback from the feedback signal when the hole being bored into the workpiece reaches the contact pad.

2. The method of claim 1, wherein the step of boring is defined further as the steps of moving a cutting device into the plated hole to remove a portion of the plated hole, stopping the movement of the cutting device and restarting the movement of the cutting device into the plated hole to remove more of the plated hole, and wherein the step of receiving feedback is defined further as receiving feedback responsive to the cutting device reaching the contact pad.

3. The method of claim 1, wherein the contact pad is a portion of a ground layer.

4. The method of claim 1, wherein the contact pad is a portion of a power layer.

5. The method of claim 1, wherein the contact pad is a part of a feedback layer formed as a separate network.

6. The method of claim 1, wherein the contact pad is a portion of a signal layer.

7. The method of claim 1 wherein the circuit board is provided with a second plated hole which is electrically connected to the contact pad.

8. The method of claim 1, further comprising the step of filling at least a portion of the hole with a non-conductive filler material.

9. The method of claim 1, wherein the contact pad substantially surrounds the plated hole.

10. The method of claim 1, wherein the plated hole is provided with at least a first portion and a second portion, and wherein the second portion has a cross-sectional area less than the cross-sectional area of the first portion.

11. A multilayer printed circuit board produced by a method comprising the steps of:
    providing a multilayer printed circuit board comprising;
    a plated hole connected to an embedded signal layer such that a stub portion of the plated hole extends from the embedded signal layer toward the exterior of the multilayer printed circuit board, a contact pad positioned adjacent to the stub portion of the plated hole, and at least one dielectric material for electrically isolating the contact pad from the signal layer and the stub portion of the plated hole;
    removing a portion of the plating from the stub portion of the plated hole by boring a portion of the plated hole with a cutting device until a transition of a physical property is detected indicative of contact between the cutting device and the contact pad; and
    filling at least the stub portion of the plated hole with a non-conductive filler material.

12. A multilayer printed circuit board produced by the method of claim 11, wherein the step of boring is defined further as the steps of moving a cutting device into the plated hole to remove a portion of the plated hole, stopping the movement of the cutting device and restarting the movement of the cutting device into the plated hole to remove more of the plated hole, and wherein the step of receiving feedback is defined further as receiving feedback responsive to the cutting device reaching the contact pad.

13. A multilayer printed circuit board produced by the method of claim 11, wherein the contact pad is a portion of a ground layer.

14. A multilayer printed circuit board produced by the method of claim 11, wherein the contact pad is a portion of a power layer.

15. A multilayer printed circuit board produced by the method of claim 11, wherein the contact pad is a part of a feedback layer formed as a separate network.

16. A multilayer printed circuit board produced by the method of claim 11, wherein the contact pad is a portion of a power layer.

17. A multilayer printed circuit board produced by the method of claim 11, wherein the circuit board is provided with a second plated hole which is electrically connected to the contact pad.

18. A multilayer printed circuit board produced by the method of claim 11, further comprising the step of filling at least a portion of the hole with a non-conductive filler material.

19. A multilayer printed circuit board produced by the method of claim 11, wherein the contact pad substantially surrounds the plated hole.

20. A multilayer printed circuit board produced by the method of claim 11, wherein the plated hole is provided with at least a first portion and a second portion, and wherein the second portion has a cross-sectional area less than the cross-sectional area of the first portion.

21. A multilayer circuit board, comprising:
    a signal layer:
    a feedback layer having a contact pad;
    a dielectric layer positioned between the signal layer and the feedback layer; and
    a plated hole connected to the signal layer, and positioned adjacent to the contact pad, the contact pad being electrically isolated from the plated hole, a portion of the plated hole forming a stub portion, which extends a distance away from the signal layer and extends a distance away from the contact pad of the feedback layer, the stub portion being backdrilled to form a backdrilled hole, and at least a portion of the backdrilled hole filled with a non-conductive filler material.

22. A multilayer circuit board, comprising:
    a signal layer;
    a feedback layer having a contact pad;

a dielectric layer positioned between the signal layer and the feedback layer; and a plated hole connected to the signal layer, and positioned adjacent to the contact pad, the contact pad being electrically isolated from the plated hole, a portion of the plated hole forming a stub portion, which extends a distance away from the signal layer and extends a distance away from the contact pad of the feedback layer, wherein the plated hole is provided with a first portion and a second portion, and wherein the second portion has a cross-sectional area less than the cross-sectional area of the first portion.

23. A method for removing an area of a circuit board, the method comprising the steps of:

applying a feedback signal to a contact pad embedded within the circuit board;

boring into the circuit board with a cutting device adjacent to the contact pad until the cutting device contacts the contact pad; and translating the cutting device to remove the area of the circuit board.

24. A method for removing an area of a circuit board, the method comprising the steps of:

applying a feedback signal to a contact pad embedded within the circuit board;

boring into the circuit board with a cutting device adjacent to the contact pad until the cutting device contacts the contact pad; and translating the cutting device to remove the area of the circuit board until the cutting device loses contact with the contact pad.

25. A method for backdrilling a stub portion of a plated hole in a multilayer circuit board, comprising the steps of:

moving a cutting device in a direction toward the plated hole such that the cutting device removes a portion of the plating adjacent the stub portion; and passing a signal into the plated hole and measuring a physical property of the signal to determine an amount of remaining stub portion of the plated hole.

26. A closed loop backdrilling system, comprising:

a circuit board having signal layer and a feedback layer connected to a plated hole;

a boring device comprising:

a measurement unit connected to the plated hole and the feedback layer to output a signal indicative of electrical disconnection between the plated hole and the feedback layer;

a spindle unit supporting a cutting device; and a servo control unit controlling the spindle unit based on the signal output by the measurement unit.

27. A closed loop backdrilling system, comprising:

a circuit board having a signal layer connected to a plated hole; and a boring device comprising:

a signal generator and measurement unit connected to the plated hole and the signal layer to provide a signal thereto and to measure a physical property of the signal to determine an amount of remaining stub portion of the plated hole;

a spindle unit supporting a cutting device; and a servo control unit controlling the spindle unit based on the measurements made by the signal generator and measurement unit.

* * * * *